United States Patent [19]
Dawe

[11] Patent Number: 5,875,188
[45] Date of Patent: Feb. 23, 1999

[54] HIGH SPEED SWITCH

[75] Inventor: Piers James Geoffrey Dawe, Sawbridgeworth, United Kingdom

[73] Assignee: Northern Telecom Limited, Montreal, Canada

[21] Appl. No.: 634,423

[22] Filed: Apr. 18, 1996

[30] Foreign Application Priority Data

Apr. 18, 1995 [GB] United Kingdom ............... 9507813.5

[51] Int. Cl.$^6$ ............................................. H04L 12/56
[52] U.S. Cl. ........................... 370/360; 370/399; 370/419
[58] Field of Search ................... 370/360, 395, 370/399, 419, 537; 340/825.89; 327/382, 407; 330/130, 147, 268, 252

[56] References Cited

U.S. PATENT DOCUMENTS

| | | | |
|---|---|---|---|
| 3,892,925 | 7/1975 | Fisk et al. ................................ | 370/364 |
| 4,057,691 | 11/1977 | Goto et al. ............................... | 379/292 |
| 4,371,797 | 2/1983 | Frank ...................................... | 307/577 |
| 4,755,765 | 7/1988 | Ferland ................................... | 330/252 |
| 5,196,733 | 3/1993 | Samsung Electronics ............. | 307/243 |
| 5,287,066 | 2/1994 | Liron et al. ............................. | 327/384 |

FOREIGN PATENT DOCUMENTS

| | | |
|---|---|---|
| 0 397 093 | 11/1990 | European Pat. Off. . |
| A58159024 | 9/1983 | Japan . |
| WO 93/13629 | 7/1993 | WIPO . |

OTHER PUBLICATIONS

Wright, "4–By–4 Crosspoint Handles 100 MHz", Electronic Design, vol. 42, No. 7, Apr. 4, 1994, pp. 75–76.

Tobagi, "Fast Packet Switch Architectures For Broadband Integrated Services Digital Networks", Proceedings of IEEE, vol. 78, No. 1, Jan. 1990, pp. 133–167.

*Primary Examiner*—Hassan Kizou
*Attorney, Agent, or Firm*—Lee, Mann, Smith McWilliams, Sweeney & Onlson

[57] ABSTRACT

An electrical switch (116) is disclosed having multiple inputs (214) and binary switches (312) operable to switch a signal from an input (214) via respective amplifiers (310). Amplifiers (310) are continuously operable and are provided with an auxiliary switching circuit (412) which provides the amplifier with a fixed voltage input signal when the associated input (214) is not selected. Response time upon selection of an amplifier (310) and crosstalk from any non-selected amplifier is minimised.

6 Claims, 2 Drawing Sheets

HIGH SPEED SWITCH

FIELD OF THE INVENTION

The present invention relates to high speed electrical switches equipped with amplifiers and in particular relates to such switches in asynchronous transfer mode (ATM) switch arrangements.

BACKGROUND TO THE INVENTION

Asynchronous transfer mode is a standardised data communications protocol and method for transferring information within a telecommunications network, e.g between two telephone exchanges. ATM operates as a cell relay mechanism wherein data is grouped into fixed length packets or cells. The cells comprise a header and a payload. The header identifies the payload and the payload can comprise video, image, bursty data or voice communications. By providing fixed length cells, information can be handled in a more reliable fashion by switches.

ATM is becoming a common technology for local area networks, metropolitan area networks and wide area networks, since all traffic types can be mixed in the same network, bandwidth can be rapidly reassigned on demand and information rates are scalable to very high speeds.

Data transmission speeds are increasing: switches need to cope with the increased data rates.

Switches determine the transmission path followed by a signal e.g. a signal from a telephone is directed via a private branch exchange to a particular communications link towards a destination telephone. The switches will have, typically, a number of inputs and a number of outputs. Obviously other types of switches occur having a single input or output.

In an m×n electrical switch, signals arrive at an input and are routed to any one of n output. The input signals however need to be amplified before further processing and thus, associated with each input there is an amplifier to amplify the signal before being routed across the switch by transistor switching means to a desired output. Two arrangements are presently in use. In the first case, when a signal is input through a particular input, the associated amplifier is switched on and a certain delay is apparent before the amplifier becomes fully operational due to reactive effects in the amplifier circuit. As switching speeds increase to nanoseconds this delay can be a serious problem. In the second case, the amplifier remains switched on so as to reduce amplifier initialisation problems; this method, however, incurs reactive coupling effects between adjacent amplifiers and signal quality is diminished. As data rates increase, reactive coupling effects increase.

The present invention seeks to provide a switch whereby the aforementioned problems are minimised.

SUMMARY OF THE INVENTION

In accordance with the invention there is provided an electrical switch comprising multiple inputs, signal amplifying means associated with each input and switching means operable to switch a signal from an input to an output wherein the amplifying means are continuously operable and each amplifying means is provided with an auxiliary switching circuit, which auxiliary switching circuit provides the amplifier with a fixed voltage input when the respective input is not selected whereby response time upon selection of an amplifier and crosstalk from any non-selected input is minimised.

In accordance with another aspect of the present invention there is provided an electrical m×n switch comprising m inputs, n outputs, signal amplifying means associated with each input and switching means operable to switch an input signal from any input to any output, wherein an operating current continuously flows through all the amplifying means, each amplifying means being provided with an amplifier and an auxiliary circuit, the auxiliary circuit being operable to disable the amplifier when the respective input is not receiving a desired signal and to enable the amplifier when a desired signal is being received by the respective input. The selecting means comprises an amplifier switching circuit which allows the amplifier to remain on stand-by. The amplifiers are thus continuously operable but do not affect operation or couple with data transmission through other inputs, yet when an amplifier is switched to an operational mode, there is no time delay and use of a particular data path is effective simultaneous with the switching of the appropriate amplifier. Such an switch may be used in an ATM arrangement, for example in telecommunications.

In accordance with a further aspect of the invention there is provided a method of operating a multiple input switch having amplification means associated with each input, comprising the steps of continuously operating the amplifiers; maintaining any non-selected amplifier at a fixed input voltage; and upon selection of an input, disabling the connection of the fixed input voltage to the respective amplifier, thereby allowing the signal from said selected input to be amplified.

BRIEF DESCRIPTION OF THE DRAWINGS

In order that a better understanding of the invention will be obtained reference will now be made to the Figures, wherein.

DETAILED DESCRIPTION OF PREFERRED EMBODIMENT

For convenience, the description of the invention refers to a high-speed switch in an ATM switch arrangement, although the switch of the present invention can be used in any switch arrangement requiring both high switching speeds and signal amplification.

Figure 1:
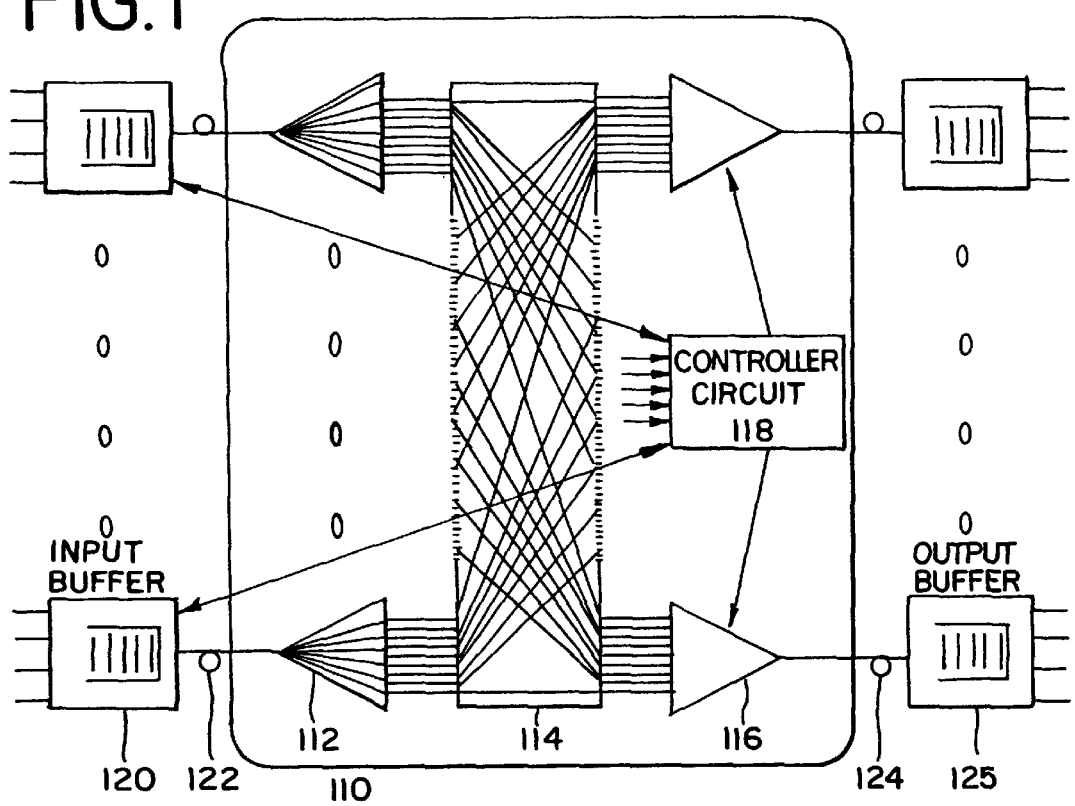
FIG. 1 shows a schematic layout of a high speed ATM switch.

Referring to FIG. 1, there is shown a typical ATM switch arrangement. The switch can carry ATM cells from input buffers 120 to appropriate output buffers 126 through the switch 110. Since there are no cell buffers in the core, transmission into the core from the individual buffer modules must be coordinated such that cells do not collide at the space switch outputs. This is achieved by a controller circuit 118 which receives status information from the buffers 120, 126. It periodically sets up space switch connections through an optical 'shuffle' matrix 114 and sends control information back to the buffers to schedule the transmission of cells from the buffers, to coincide with the switching of the signals. The shuffle matrix 114 receives signals from each input buffer 120 via input fibres 122 and splitters 112, and distributes a signal portion to each selector 116. In the switch the control paths and the data paths are separated both functionally and physically. The selector 116 outputs an electrical signal which controls laser 224 (FIG. 2) which provides an optical signal which outputs through the output buffer 126 via output fibre 124.

Cell routing information, provided in the ATM header is conveyed to the core controller over the control paths. The high speed data paths carry cells transparently from buffer to buffer through the switch; the switch does not inspect cell headers for routing. This requires synchronisation between control and data paths: the core must establish and hold connections in time with the passage of cells. Because of the high bit rates involved, in certain instances connections are set-up for durations much longer than 1 cell period, to allow sufficient guard time between cell streams, of the order of 1 or 2 cell periods (1 cell period=40 nsec approximately) wherein WDM or other means are employed to provide a predictable limit on time skew between control and data paths. ATM cells accumulate in buffers, segregated by intended output, until a path is set up by the core controller. Then, once a switch path exists, all or a specified number of cells in the buffer are transferred in a single batch to the output buffer and the connection is realised. It is the function of the controller to arbitrate requests for connections, and satisfy them in a fair and timely manner to achieve performance objectives.

ATM cell buffers provide temporary storage between a random or a high speed source of cells, and a constrained sink such as a switch. The average outflow must equal the average inflow, or the buffer overflows or underflows. Underflow cannot occur in an ATM system since idle cells can (and must) be generated whenever the buffer is empty.

The functions of the input and output buffers are quite distinct, although it is envisaged that they could be combined in a single in-out buffer for each link, with a time divided buffer control circuit serving both functions. The purpose of the input buffer is twofold, to provide a logical segregation of incoming traffic into pages according to destination (and possibly priority) and to ensure delivery of cells from the selected page to the space switch at the link rate. The function of the output buffer is primarily to accept all cells that come down the high speed link from the space switch core.

Figure 2:
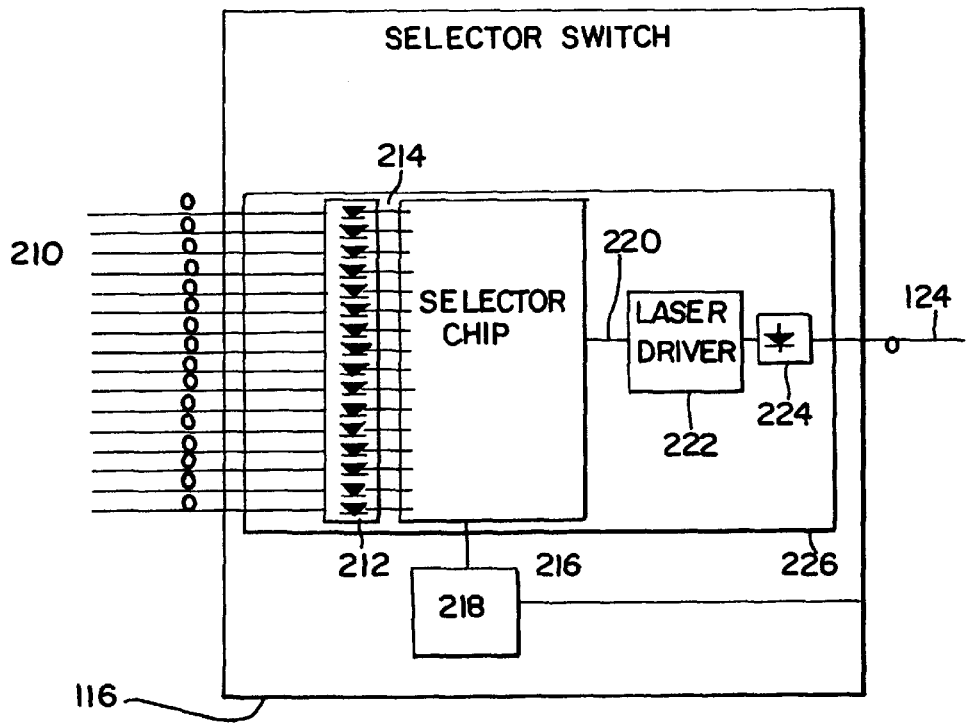
FIG. 2 details a selector having a select chip incorporating an electrical switch in accordance with the invention.
Figure 3:
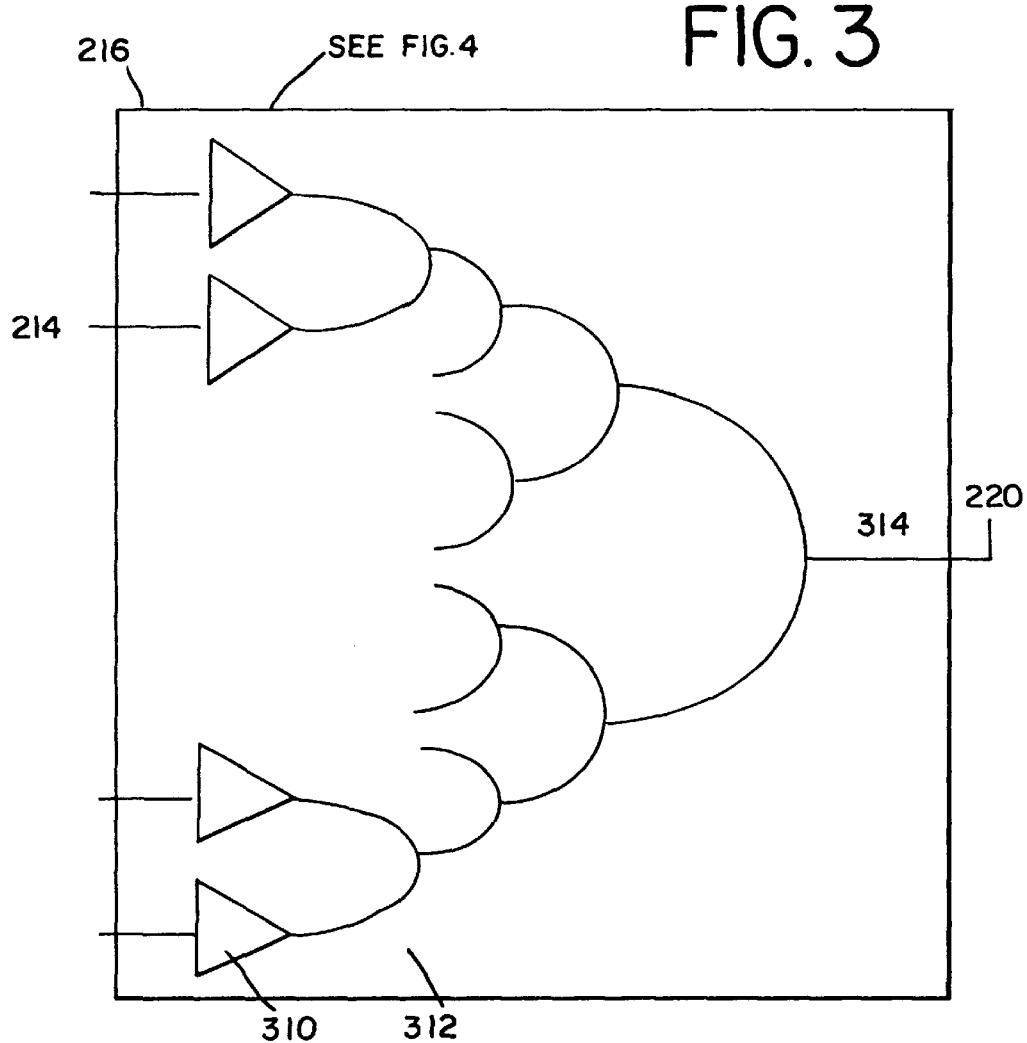
FIG. 3 shows amplifiers and switches on the chip selector.

Referring now to FIG. 2, there is shown a sixteen-input-one-output (M=16; N=1) selector switch 116 wherein an optical signal from one fibre of a number of input fibres 210 is converted to an electrical signal by a photodiode arrangement 212. The photo-diodes convert received optical signals to electrical signals and output the electrical signals via wire bond connections 214 to amplifiers on a selector chip 216. Typically the photodiodes are formed on an indium phosphide chip. Signals from the photodiodes are amplified and then selectively connected to a particular output by a series of switches such as 2:1 binary switches whereby only one input signal is connected to an output at any one time. FIG. 3 details a switch arrangement having 16 electrical inputs 214 (this figure shows only the first two and last two inputs), amplifiers 310 serving each input 214 which outputs to switches 312. Switches 312 are shown as binary switches which are cascaded to a single output 314 which outputs via an electrical wire 220. Switches 312 are under the control of control means 118 (see FIG. 1). Binary switches 312 could be replaced by, for example, 4×1 switches or other known types. Output signals control laser driver 222 (see FIG. 2) which controls laser 224 which, in turn, outputs a data signal via fibre 124 to output buffer 126.

Figure 4:
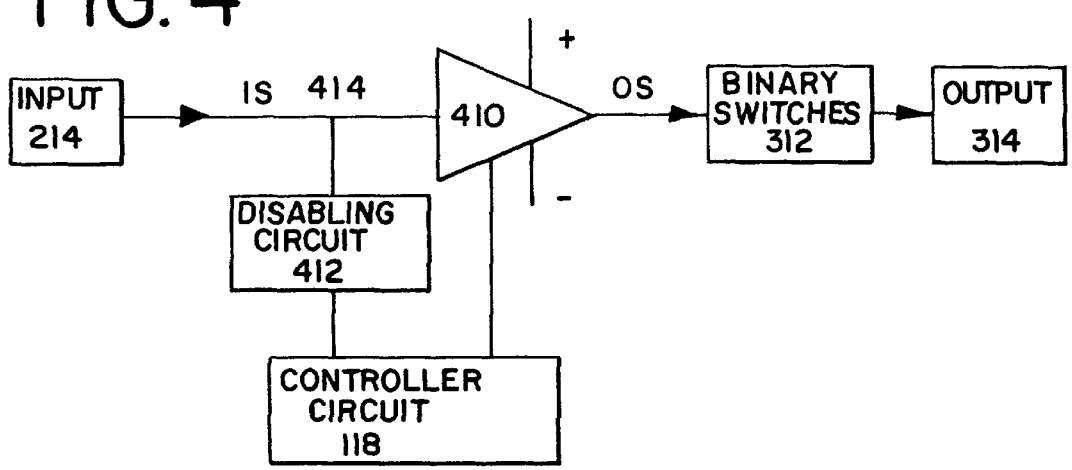
FIG. 4 shows an amplifier arrangement as shown in FIG. 3.

Known amplifiers, as discussed earlier, are either operational at all times and are thus susceptible of causing cross-talk or are operational only when required, requiring reactive charge-up time. In the arrangement shown in FIG. 4, amplifier 410 receives an input signal IS from input 214, with the input line also being connected to a disabling circuit 412 at node 414. Amplifier 410 and disabling circuit 412 are controlled by control signals from controller 118. Amplifier 410 remains connected to the input 214 and powered-up at all times, but by reason of node 414 being connected to disabling circuit 412, when disabling circuit 412 is operated, node 414 is held to a fixed voltage whereby input signal IS is not amplified and accordingly minimal cross-talk is produced between selected and non-selected signals. Since the amplifier is biased in an operable state at its operating voltage, when it is desired to route a signal through a particular amplifier 410, a control signal is enabled to switch off the associated disabling circuit 412 whereby the input signal IS is amplified by amplifier 410 without any appreciable delay (more than a few nano-seconds). The output signal OS from the amplifier can be switched through binary switch arrangement 312 to output 314.

The disabling circuit conveniently comprises a transistor circuit whereby when activated, node 414 is connected to a voltage source which disables the amplifier. The use of transistors as a switch is well known in the art and those skilled in the art will have no difficulty in designing a suitable arrangement. Control means 118 can comprise an auxiliary bias circuit to hold the amplifier at a correct voltage, as is known.

I claim:

1. A high-speed electrical switch comprising multiple inputs, signal amplifying means comprising an amplifier associated with each input and switching means operable to switch an amplified signal from an input to an output, each amplifier being provided with an auxiliary switching circuit, which auxiliary switching circuit provides the amplifier with a fixed voltage input when the respective input is not selected and wherein the amplifying means are continuously biased in an operable state at their operating voltage whereby response time upon selection of an input to an amplifier and crosstalk from any non-selected amplifier is minimised.

2. An ATM switch comprising an electrical switch as claimed in claim 1.

3. A switch for use in a telecommunications network comprising an electrical switch as claimed in claim 1.

4. A switch for use in a telecommunications network comprising an electrical switch as claimed in claim 1, wherein each input receives a signal from a photodiode receptive to optical communication signals.

5. A switch as claim in claim 1 wherein the switch is an m×n switch comprising m inputs and n outputs and wherein the switching means is operable to switch an input signal from any input to any output.

6. A method of operating a high-speed multiple input switch having amplification means comprising an amplifier associated with each input, the method comprising the steps of:

maintaining any non-selected amplifier at a fixed input voltage;

upon selection of an input, disabling connection of the fixed input voltage to the selected amplifier, thereby allowing the signal from said selected input to be amplified by the selected amplifier;

switching an amplified signal to an output; and maintaining the amplification means continuously biased in an operable state at their operating voltage.

* * * * *